United States Patent
Jang et al.

(10) Patent No.: US 11,748,007 B2
(45) Date of Patent: Sep. 5, 2023

(54) MEMORY, MEMORY SYSTEM, AND OPERATION METHOD OF MEMORY SYSTEM

(71) Applicant: SK hynix Inc., Gyeonggi-do (KR)

(72) Inventors: Munseon Jang, San Jose, CA (US); Hoiju Chung, San Jose, CA (US); Jang Ryul Kim, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 157 days.

(21) Appl. No.: 17/354,482

(22) Filed: Jun. 22, 2021

(65) Prior Publication Data

US 2021/0397355 A1 Dec. 23, 2021

Related U.S. Application Data

(60) Provisional application No. 63/178,320, filed on Apr. 22, 2021, provisional application No. 63/042,208, filed on Jun. 22, 2020.

(51) Int. Cl.
*G06F 3/06* (2006.01)
*G11C 29/00* (2006.01)

(52) U.S. Cl.
CPC .......... *G06F 3/0635* (2013.01); *G06F 3/0619* (2013.01); *G06F 3/0655* (2013.01); *G06F 3/0673* (2013.01); *G11C 29/76* (2013.01)

(58) Field of Classification Search
None
See application file for complete search history.

(56) References Cited

U.S. PATENT DOCUMENTS

| | | | | |
|---|---|---|---|---|
| 5,513,144 A | * | 4/1996 | O'Toole | G11C 29/44 365/233.5 |
| 6,285,606 B1 | * | 9/2001 | Ozeki | G11C 29/84 365/225.7 |
| 9,349,491 B1 | * | 5/2016 | Morgan | G11C 29/88 |
| 10,628,265 B2 | | 4/2020 | Kim et al. | |
| 2013/0210170 A1 | * | 8/2013 | Chou | G11C 29/24 438/4 |
| 2015/0006995 A1 | * | 1/2015 | Yoon | G11C 29/44 714/766 |
| 2015/0242269 A1 | * | 8/2015 | Pelley | G06F 11/1048 714/764 |
| 2015/0287480 A1 | * | 10/2015 | Wilson | G11C 29/04 365/96 |
| 2018/0188960 A1 | * | 7/2018 | Pico | G06F 3/0679 |
| 2020/0411132 A1 | * | 12/2020 | Hulton | G06F 12/126 |

* cited by examiner

*Primary Examiner* — Kaushikkumar M Patel
(74) *Attorney, Agent, or Firm* — IP & T GROUP LLP (57) ABSTRACT

A memory includes: a non-volatile memory suitable for storing a defect address; a register suitable for receiving and storing the defect address from the non-volatile memory during a boot-up operation, and receiving and storing an address that is input from an exterior during a register access operation; a comparison circuit suitable for comparing the address stored in the register with an address that is input from the exterior to produce a comparison result; redundant memory cells that are accessed according to the comparison result of the comparison circuit and a redundancy activation bit; and normal memory cells that are accessed according to the comparison result of the comparison circuit and the redundancy activation bit.

11 Claims, 5 Drawing Sheets

MEMORY, MEMORY SYSTEM, AND OPERATION METHOD OF MEMORY SYSTEM

CROSS-REFERENCE TO RELATED APPLICATIONS

The present application claims the benefit of U.S. Provisional Application No. 63/042,208, filed on Jun. 22, 2020 and U.S. Provisional Application No. 63/178,320, filed on Apr. 22, 2021 the entire contents of which are incorporated herein by reference.

BACKGROUND

1. Field

Various embodiments of the present invention relate to a memory and a memory system.

2. Description of the Related Art

In the early stage of the semiconductor memory device industry, there were many originally good dies on the wafers, which means that memory chips were produced with no defective memory cells through a semiconductor fabrication process. However, as the capacity of memory devices increased, it became difficult to fabricate a memory device that does not have any defective memory cells. Nowadays, it may be said that there is substantially no chance that a memory device is fabricated without any defective memory cells. To address this problem, a repair method of including redundancy memory cells in a memory device and replacing defective memory cells with the redundancy memory cells, is disclosed.

Post-package repair means repairing a memory after the package process. Post-package repair may be performed not only in the fabrication process of a memory, but also in the process when the memory is used by a user. When a defect is detected while the memory is used by a user and a post-package repair operation is to be performed, it is preferable to copy the data of a defective memory cell to a redundant memory cell.

SUMMARY

Embodiments of the present invention are directed to a technology for repairing a memory in real-time.

In accordance with an embodiment of the present invention, a memory includes: a non-volatile memory suitable for storing a defect address; a register suitable for receiving and storing the defect address from the non-volatile memory during a boot-up operation, and receiving and storing an address that is input from an exterior during a register access operation; a comparison circuit suitable for comparing the address stored in the register with an address that is input from the exterior to produce a comparison result; redundant memory cells that are accessed according to the comparison result of the comparison circuit and a redundancy activation bit; and normal memory cells that are accessed according to the comparison result of the comparison circuit and the redundancy activation bit.

In accordance with another embodiment of the present invention, a memory system includes: a memory; and a memory controller suitable for controlling the memory, wherein the memory comprises: a non-volatile memory suitable for storing a defect address; a register suitable for receiving and storing the defect address from the non-volatile memory during a boot-up operation, and receiving and storing an address that is input from the memory controller during a register access operation; a comparison circuit suitable for comparing the address stored in the register with an address that is input from the memory controller to produce a comparison result; redundant memory cells that are accessed according to the comparison result of the comparison circuit and a redundancy activation bit; and normal memory cells that are accessed according to the comparison result of the comparison circuit and the redundancy activation bit.

In accordance with yet another embodiment of the present invention, a method for operating a memory system includes: detecting, by a memory controller, defective memory cells of a memory; replacing, by the memory controller, the defective memory cells with redundant memory cells of the memory by storing defect addresses corresponding to the defective memory cells in a register of the memory; deactivating, by the memory controller, redundancy access of the memory; reading, by the memory, data from the defective memory cells of the memory and transferring, by the memory, the read data to the memory controller; storing, by the memory controller, the data in a cache of the memory controller; activating, by the memory controller, redundancy access of the memory; transferring, by the memory controller, a write command, the defect address, and the data stored in the cache to the memory; and writing, by the memory, the transferred data into the redundant memory cells.

In accordance with still another embodiment of the present invention, a method for operating a memory system includes: detecting, by a memory controller, defective memory cells of a memory; replacing, by the memory controller, the defective memory cells with redundant memory cells of the memory by storing defect addresses corresponding to the defective memory cells in a register of the memory; deactivating, by the memory controller, redundancy access of the memory; reading, by the memory, data from the defective memory cells of the memory and storing, by the memory, the read data in a cache of the memory; activating, by the memory controller, redundancy access of the memory; and writing, by the memory, the data stored in the cache into the redundant memory cells.

In accordance with still another embodiment of the present invention, a memory system includes: a memory device including first and second groups of memory cells, the first group storing data; and
a control circuit suitable for controlling, when detecting a defect from the first group, the memory device to move the data from the first group to the second group, wherein the memory device is suitable for accessing, after the move, the second group in response to a request for accessing the first group.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
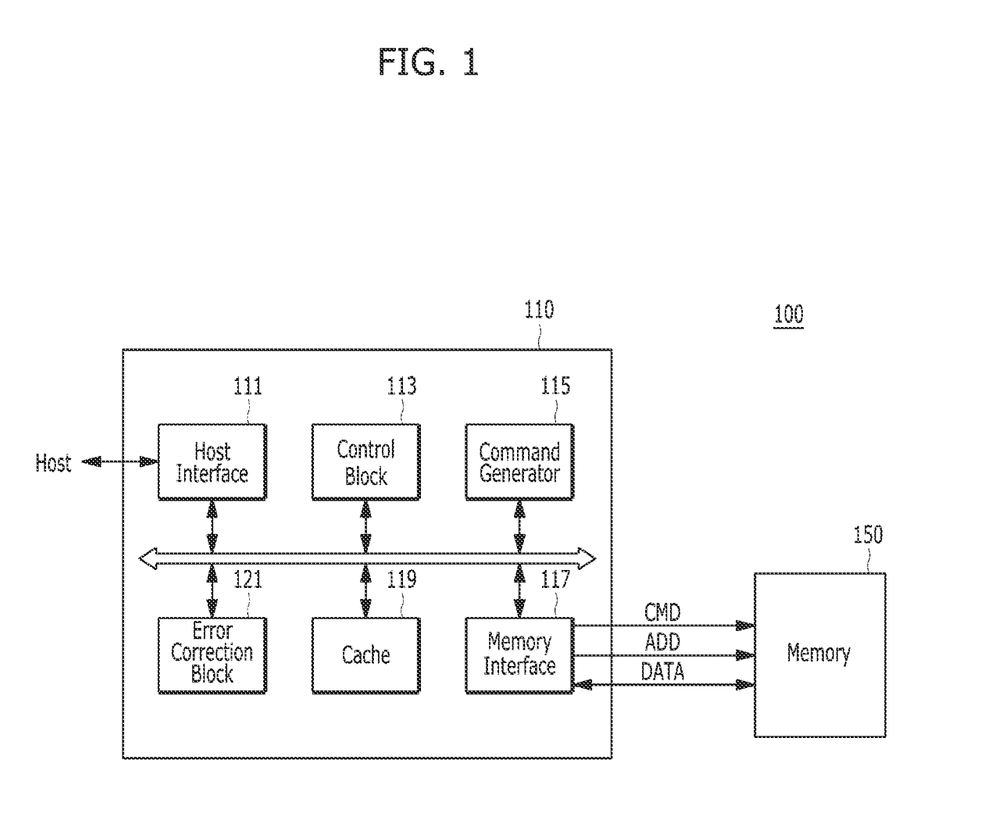
FIG. 1 is a block diagram illustrating a memory system 100 in accordance with an embodiment of the present invention.

FIG. 1 is a block diagram illustrating a memory system 100 in accordance with an embodiment of the present invention.

Referring to FIG. 1, the memory system 100 may include a memory controller 110 and a memory 150.

The memory controller 110 may control the operation of the memory 150 according to the request of a host HOST. The host HOST may include a Central Processing Unit (CPU), a Graphic Processing Unit (GPU), an Application Processor (AP), and the like. The memory controller 110 may include a host interface 111, a control block 113, a command generator 115, a memory interface 117, a cache 119, and an error correction block 121. The memory controller 110 may be included in a CPU, GPU, AP, or the like. In this case, the host HOST may mean a constituent element other than the memory controller 110 in this structure. For example, when the memory controller 110 is included in a CPU, the host HOST in the drawing may represent the other constituent elements of the CPU except for the memory controller 110.

The host interface 111 may be an interface for communication between the host HOST and the memory controller 110.

The control block 113 may control the general operation of the memory controller 110 and schedule the operation to be directed to the memory 150. The control block 113 may make the reception order of the requests from the host HOST and the order of operations to be directed to the memory 150 different in order to improve the performance of the memory 150. For example, even though the host HOST first requests a read operation of the memory 150 and then requests a write operation, the order may be adjusted so that the write operation is performed before the read operation.

The command generator 115 may generate a command to be applied to the memory 150 in accordance with the order of the operations determined by the control block 113.

The memory interface 117 may be an interface between the memory controller 110 and the memory 150. A command CMD and an address ADD may be transferred from the memory controller 110 to the memory 150 through the memory interface 117, and data DATA may be transferred/received. The memory interface 117 may also be referred to as a PHY interface.

The cache 119 may be a memory that temporarily stores data read from the memory 150 or temporarily stores data to be written to the memory 150. The cache may be a Static Random Access Memory (SRAM).

The error correction block 121 may generate an error correction code (ECC) based on the data to be written to the memory 150, and may correct an error in the data read from the memory 150 based on the error correction code. The data DATA transferred and received between the memory interface 117 and the memory 150 may include raw data and an error correction code corresponding to the raw data.

The memory 150 may perform an operation directed by the memory controller 110. The memory 150 will be described in detail below with reference to FIG. 2.

Figure 2:
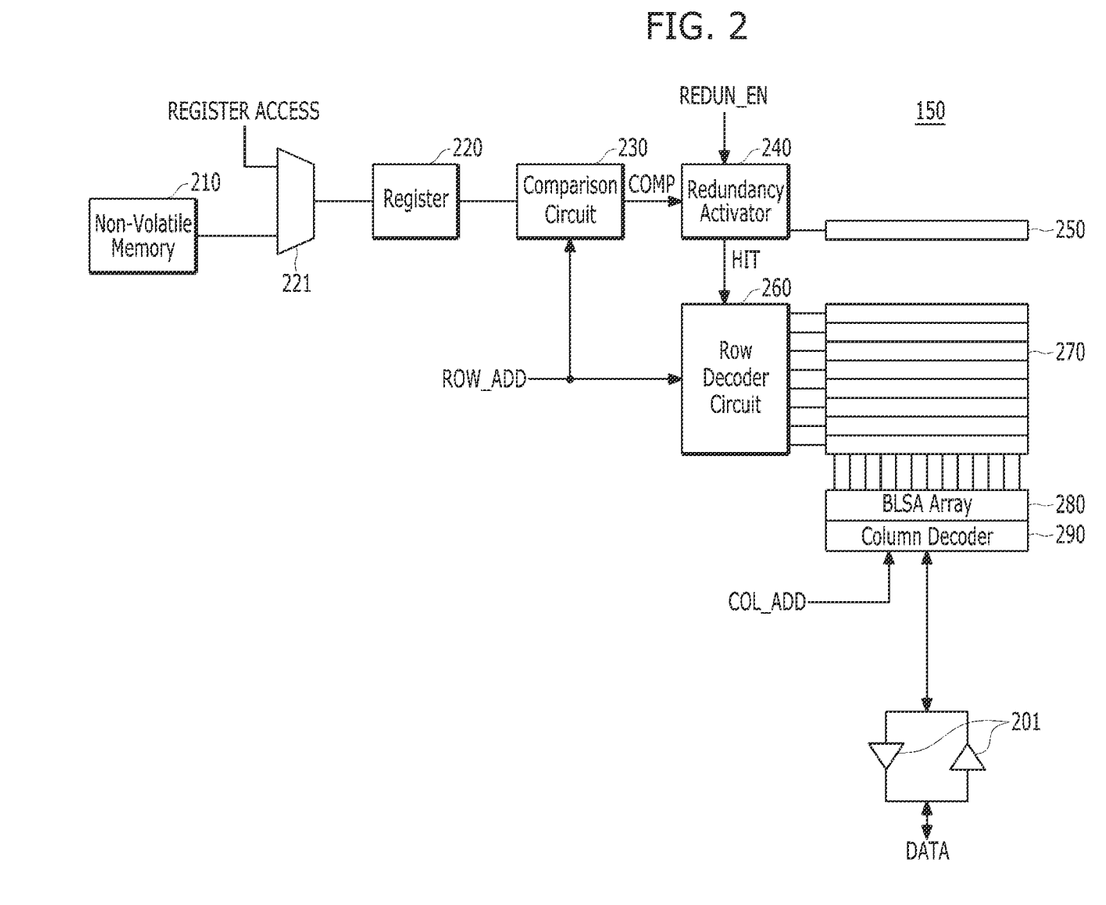
FIG. 2 is a block diagram illustrating a memory 150 shown in FIG. 1 in accordance with the embodiment of the present invention.

FIG. 2 is a block diagram illustrating the memory 150 shown in FIG. 1 in accordance with the embodiment of the present invention. In FIG. 2, only a portion directly related to the storing and repairing of data in the memory 150 is illustrated.

Referring to FIG. 2, the memory 150 may include a non-volatile memory 210, a register 220, a comparison circuit 230, a redundancy activator 240, redundant memory cells 250, a row decoder circuit 260, and normal memory cells 270, a bit line sense amplifier array 280, a column decoder 290, and a data transferring/receiving circuit 201.

The non-volatile memory 210 may store defect addresses corresponding to defective memory cells among the normal memory cells 270. The non-volatile memory 210 may include a plurality of e-fuses. The non-volatile memory 210 may also be called a one-time-program memory or a Read Only Memory (ROM) because the non-volatile memory 210 includes memory cells (e.g., E-Fuses) that may be programmed only once, and after being programmed, only reads are possible. The defect address stored in the non-volatile memory 210 may be transferred to and stored in the register 220 during a boot-up operation performed when the memory 150 is initialized.

The register 220 may store an address transferred by a multiplexer 221. The multiplexer 221 may transfer a defect address output from the non-volatile memory 210 to the register 220 during a boot-up operation, and transfer an address transferred from the memory controller 110 to the register 220 during a register access operation. In the figure, "REGISTER ACCESS" may indicate the address transferred from the memory controller 110 during a register access operation. The register access operation may refer to an operation in which the memory controller 110 directly writes a defect address into the register 220, and in this case, normal memory cells corresponding to the defect address transferred from the memory controller 110 may be repaired.

The comparison circuit 230 may compare the address stored in the register 220 with a row address ROW_ADD transferred from the memory controller 110. When the comparison result of the comparison circuit 230 reveals that the row address ROW_ADD is the same as the address stored in the register 220, a signal COMP may be activated, and otherwise, the signal COMP may be deactivated.

The redundancy activator 240 may store a redundancy activation bit REDUN_EN. The redundancy activation bit REDUN_EN may be a bit which is set by the control of the memory controller 110. When the redundancy activation bit REDUN_EN is activated, a hit signal HIT may be activated or deactivated according to the logic level of the signal COMP, and when the redundancy activation bit REDUN_EN is deactivated, the hit signal HIT may be always deactivated. When the hit signal HIT is activated, the redundant memory cells 250 may be accessed, and the normal memory cells 270 may be kept away from being accessed. Herein, the redundant memory cells 250 being accessed may mean that a word line corresponding to the redundant memory cells 250 is activated.

Table 1 below summarizes the activation conditions of the hit signal HIT, that is, the access conditions of the redundant memory cells 250.

TABLE 1

| COMP | REDUN_EN | HIT |
|---|---|---|
| 1 | 1 | 1 |
| 0 | 1 | 0 |
| Don't care | 0 | 0 |

The normal memory cells 270 may be arranged in a plurality of rows and a plurality of columns. The redundant memory cells 250 may be used to replace the normal memory cells of a defective row among the normal memory cells 270. FIG. 2 illustrates that the redundant memory cells 250 are in one row, however it should be apparent to those skilled in the art that the redundant memory cells 250 may be in a plurality of rows.

The row decoder circuit 260 may select and access one row among a plurality of rows of the normal memory cells 270 by decoding the row address ROW_ADD transferred from the memory controller 110. In other words, the row decoder circuit 260 may activate a row (i.e., word line) which is selected based on the row address ROW_ADD among the rows of the normal memory cells 270. When the hit signal HIT is activated, the row decoder circuit 260 may be deactivated, and access to the normal memory cells 270 may be prohibited.

The bit line sense amplifier array 280 may sense and amplify the data of the memory cells of a row which is activated among the normal memory cells 270 and the redundant memory cells 250.

The column decoder 290 may select columns (i.e., bit lines) to be accessed in response to a column address COL_ADD. The data of the columns selected by the column decoder 290 among the data sensed and amplified by the bit line sense amplifier array 280 may be input/output during read and write operations.

The data transferring/receiving circuit 201 may transfer/receive data DATA to and from the memory controller 110. During a read operation, data DATA may be transferred from the memory 150 to the memory controller 110, and during a write operation, data DATA may be transferred from the memory controller 110 to the memory 150.

Figure 3:
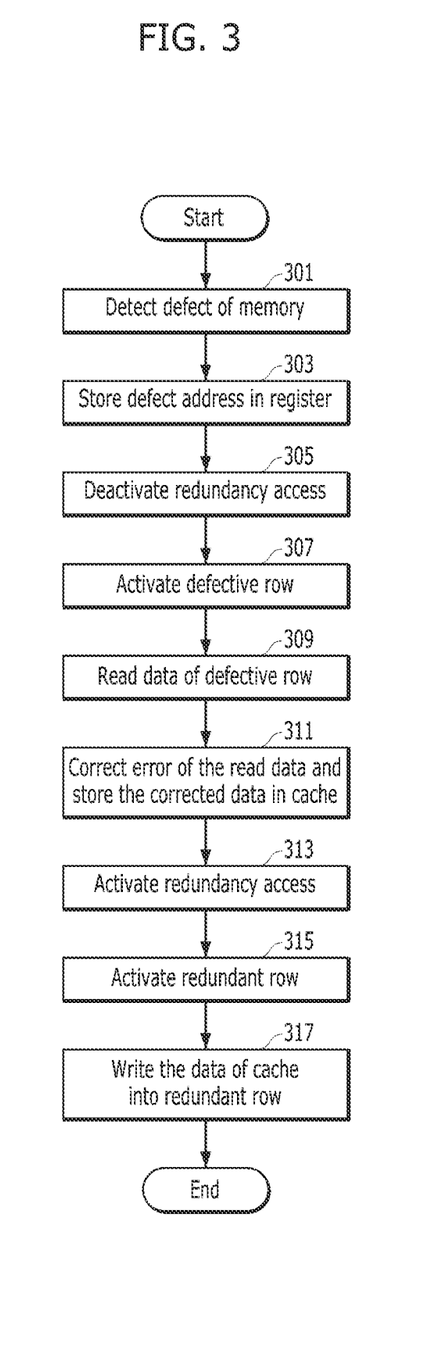
FIG. 3 is a flowchart describing an operation of the memory system 100 shown in FIG. 1 in accordance with an embodiment of the present invention.

FIG. 3 is a flowchart describing an operation of the memory system 100 shown in FIG. 1 in accordance with an embodiment of the present invention. FIG. 3 shows a process of repairing a defect in real-time when the defect is detected during the operation of the memory system 100.

Referring to FIG. 3, first, the memory controller 110 may detect a defect in the memory 150 in operation 301. The memory controller 110 may detect and correct an error by using an error correction block 121 every time a read operation of the memory 150 is performed. As a result, it is possible to determine which region of the memory 150 is defective. Hereinafter, as an example, a defect is detected in the normal memory cells in row 5 among the normal memory cells 270 of the memory 150.

Through a register access operation, a defect address transferred from the memory controller 110 may be stored in the register 220 of the memory 150 in operation 303. In other words, the memory controller 110 may direct the memory 150 to perform a register access operation, and the memory controller 110 may transfer a defect address corresponding to the row 5 to the memory 150 and store the defect address corresponding to the row 5 in the register 220.

The redundancy access of the memory 150 may be deactivated under the control of the memory controller 110 in operation 305. This may be performed by storing the redundancy activation bit REDUN_EN having a value of '0' in the redundancy activator 240 under the control of the memory controller 110. Since redundancy access is deactivated, the access to the redundant memory cells 250 may be prohibited. In other words, while the redundancy access is deactivated, the hit signal HIT may not be activated.

Now, the operations 307 and 309 for reading the data of a defective row among the normal memory cells may be performed.

First, a defective row among the normal memory cells 270 may be activated in operation 307, When the memory controller 110 transfers a row address ROW_ADD corresponding to the row 5, which is a bad row, to the memory 150 along with an active command, the row 5 among the normal memory cells 270 of the memory 150 may be activated.

Now, the data of the defective row may be read and transferred to the memory controller in operation 309. When the memory controller 110 transfers a column address COL_ADD to the memory 150 together with a read command, the data of the memory cells corresponding to the column address COL_ADD in the defective row (i.e., the row 5) of the memory 150 may be read and transferred to the memory controller 110. The operation 309 may be performed multiple times while changing the column address COL_ADD, so that the data of all the columns of the defective row (i.e., the row 5) may be transferred to the memory controller 110. After the read operation is completed, the activation of the defective row (i.e., the row 5) of the normal memory cells 270 may be terminated. In other words, the defective row of the normal memory cells 270 may be precharged.

The memory controller 110 may correct an error of the data transferred from the memory 150 by using the error correction block 121 and store the error-corrected data in the cache 119 in operation 311.

The redundancy access of the memory 150 may be activated under the control of the memory controller 110 in operation 313. This may be performed by storing the redundancy activation bit REDUN_EN having a value of '1' in the redundancy activator 240 under the control of the memory controller 110. Since the redundancy access is now activated, when the address stored in the register 220 and the row address ROW_ADD are the same, the redundant memory cells 250 may he accessed.

Now, operations 315 and 317 for writing the data of the cache 119 into the redundant memory cells 250 may be performed.

First, a redundant row corresponding to the redundant memory cells 250 may be activated in operation 315). When the memory controller 110 transfers a row address ROW_ADD corresponding to the row 5, which is a defective row, to the memory 150 along with an active command, the redundant row corresponding to the redundant memory cells 250 in the memory 150 may be activated. Since the defect address stored in the register 220 and the row address ROW_ADD are the same, the output COMP of the comparison circuit 230 may be activated to '1', and since the redundancy activation bit REDUN_EN is activated to '1', the redundant row may be activated. Also, since the hit signal HIT is activated to '1', the row decoder circuit 260 may be deactivated and the row 5 of the normal memory cells 270 may not be activated.

Now, an operation of writing the data in the cache 119 into the redundant row of the memory 150 may be performed in operation 317. When the memory controller 110 transfers the data stored in the cache 119 to the memory 150 along with the write command and the column address COL_ADD, the data may be written into the memory cells corresponding to the column address COL_ADD in the redundant row of the memory 150. This operation 317 may be performed multiple times while changing the column address COL_ADD so that all the data in the cache 119 may be written into the redundant row of the memory 150. After the write operation is completed, the activation of the redundant row may be terminated. In other words, the redundant rows may be precharged.

Through the above-described operation, the defective memory cells detected in the memory 150 may be repaired with the redundant memory cells 250, and the data of the defective memory cells may be copied into the redundant memory cells 250 after error correction. In other words, since the defect detected in the memory 150 is repaired in real-time (runtime) and the data are also copied into the repaired region, the memory system 100 may continue to perform normal operations.

Later, when the memory system 100 is rebooted, the defect address may be programmed into the non-volatile memory 210 for permanent repair. In this case, even though the power of the memory system 100 is turned off, the repair effect may last.

Figure 4:
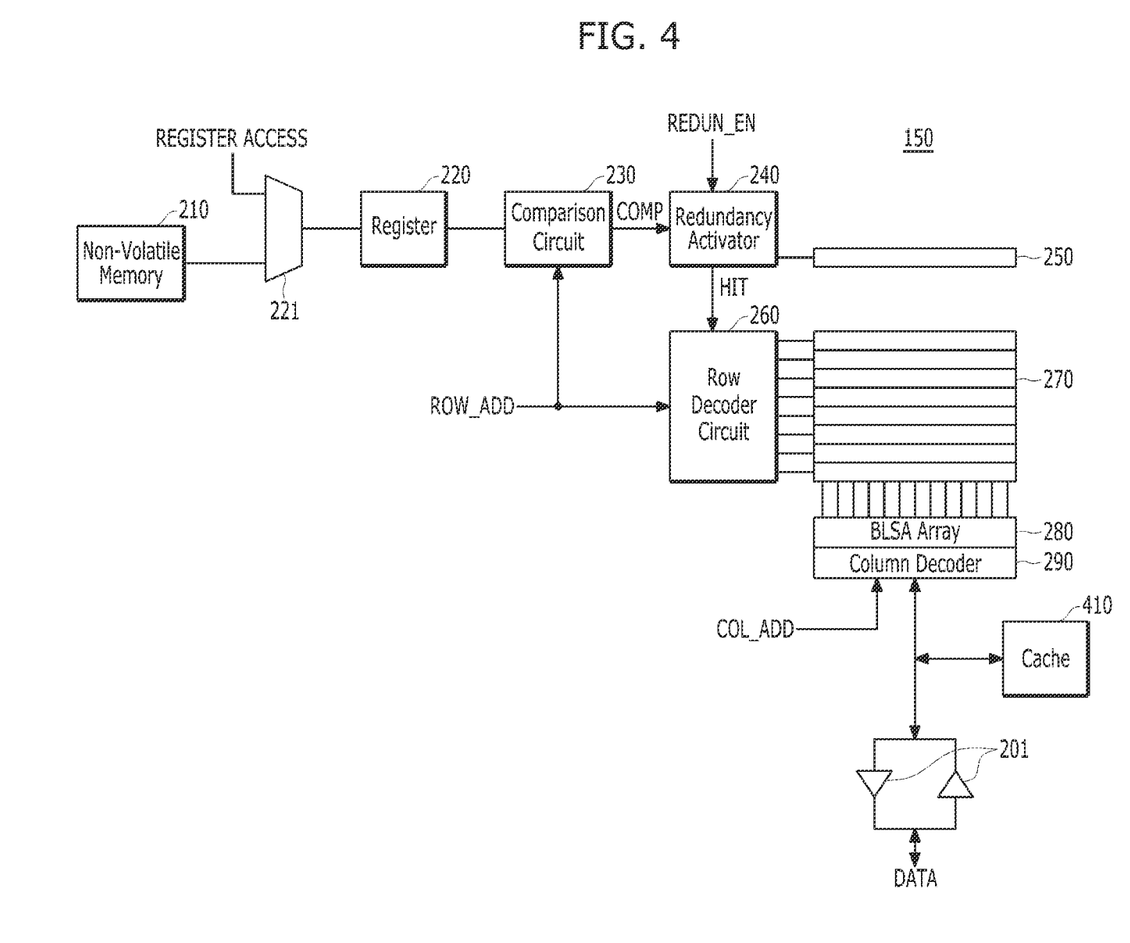
FIG. 4 is a block diagram illustrating the memory 150 shown in FIG. 1 in accordance with another embodiment of the present invention.

FIG. 4 is a block diagram illustrating the memory 150 shown in FIG. 1 in accordance with another embodiment of the present invention. In FIG. 4, only a portion directly related to data storage and repair in the memory 150 is illustrated.

Just like the memory 150 shown in FIG. 2, the memory 150 of FIG. 4 may include a non-volatile memory 210, a register 220, a comparison circuit 230, a redundancy activator 240, redundant memory cells 250, a row decoder circuit 260, normal memory cells 270, a bit line sense amplifier array 280, a column decoder 290, and a data transferring/receiving circuit 201. It may further include a cache 410 in addition to the constituent elements of the memory 150 of FIG. 2.

The cache 410 may be provided to support a cache read operation and a cache write operation. During a cache read operation, data read from the normal memory cells 270 or the redundant memory cells 250 may not be transferred to the memory controller 110 through the data transferring/receiving circuit 201 but may be transferred to and stored in the cache 410. Also, during a cache write operation, data stored in the cache 410 instead of the data transferred from the memory controller 110 through the data transferring/receiving circuit 201 may be written into the normal memory cells 270 or the redundant memory cells 250.

Figure 5:
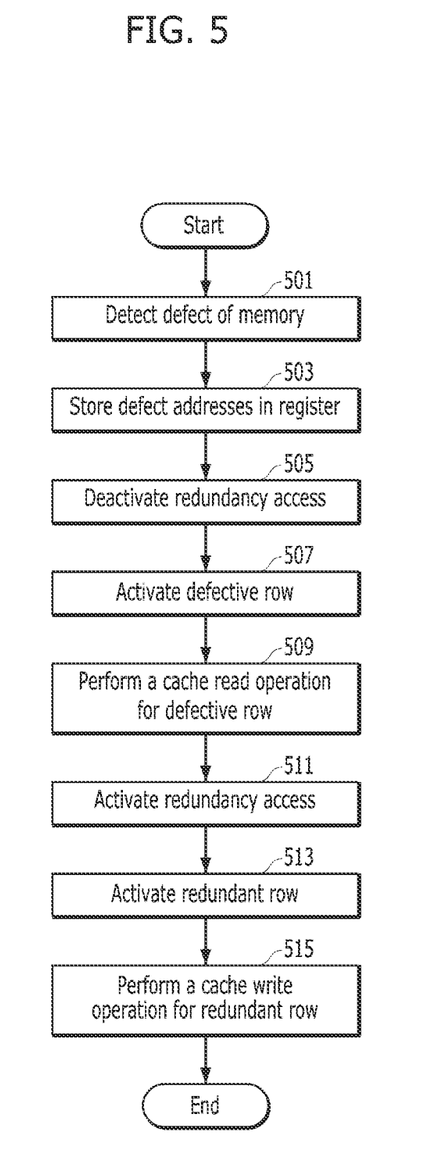
FIG. 5 is a flowchart describing an operation of the memory system 100 shown in FIG. 1 in accordance with another embodiment of the present invention.

FIG. 5 is a flowchart describing an operation of the memory system 100 shown in FIG. 1 in accordance with another embodiment of the present invention. In FIG. 5, a process of repairing a defect in real-time is described when the memory 150 is formed as shown in FIG. 4 and when the defect is detected during the operation of the memory system 100.

Referring to FIG. 5, first, the memory controller 110 may detect a defect in the memory 150 in operation 501. The memory controller 110 may detect and correct an error by using an error correction block 121 every time a read operation of the memory 150 is performed. Through this, it is possible to determine which region of the memory 150 is defective. Hereinafter, as an example, a defect is detected in the normal memory cells of a row 5 among the normal memory cells 270 of the memory 150.

Through the register access operation, the defect address transferred from the memory controller 110 may be stored in the register 220 of the memory 150 in operation 503. In other words, the memory controller 110 may direct the memory 150 to perform a register access operation, and the memory controller 110 may transfer the defect address corresponding to the row 5 to the memory 150 to store the defect address corresponding to the row 5 in the register 220.

The redundancy access of the memory 150 may be deactivated under the control of the memory controller 110 in operation 505. This may be performed by storing a redundancy activation bit REDUN_EN having a value of '0' in the redundancy activator 240 under the control of the memory controller 110. Since the redundancy access is deactivated, access to redundant memory cells 250 may be prohibited. In other words, while the redundancy access is deactivated, a hit signal HIT may not be activated.

Now, operations 507 and 509 for reading the data of the defective row among the normal memory cells may be performed.

First, the defective row among the normal memory cells 270 may be activated in operation 507, When the memory controller 110 transfers a row address ROW ADD corresponding to the row 5, which is a defective row, to the memory 150 along with an active command, the row 5 among the normal memory cells 270 of the memory 150 may be activated.

Now, the data of the defective row may be read and stored in the cache 410 in operation 509. When the memory controller 110 transfers a column address COL_ADD to the memory 150 along with a cache read command, the data of the memory cells corresponding to the column address COL_ADD in the defective row (i.e., the row 5) of the memory 150 may be read and stored in the cache 410. This operation 509 may be performed multiple times while changing the column address COL_ADD, so that the data of all the columns of the defective row (i.e., the row 5) may be stored in the cache 410. After the cache read operation is completed, activation of the defective row (i.e., the row 5) of the normal memory cells 270 may be terminated. In other words, the defective row of the normal memory cells 270 may be precharged.

The redundancy access of the memory 150 may be activated under the control of the memory controller 110 in operation 511. This may be performed by storing a redundancy activation bit REDUN_EN having a value of '1' in the redundancy activator 240 under the control of the memory controller 110. Since the redundancy access is now activated, when the address stored in the register 220 and the row address ROW_ADD are the same, the redundant memory cells 250 may he accessed.

Now, operations 513 and 515 for writing the data of the cache 41 into the redundant memory cells 250 may he performed.

First, a redundant row corresponding to the redundant memory cells 250 may be activated in operation 513. When the memory controller 110 transfers a row address ROW_ADD corresponding to the row 5, which is a defective row, to the memory 150 along with an active command, the redundant row corresponding to the redundant memory cells 250 in the memory 150 may be activated. Since the defect address stored in the register 220 and the row address (ROW_ADD) are the same, the output COMP of the comparison circuit 230 may be activated to '1', and since the redundancy activation bit REDUN_EN is activated to '1', the redundant row may be activated. Also, since the hit signal HIT is activated to '1', the row decoder circuit 260 may be deactivated and the row 5 of the normal memory cells 270 may not be activated.

Now, a cache write operation in which the data in the cache 410 are written into a redundant row of the memory 150 may be performed in operation 515. When the memory controller 110 transfers the cache write command and the column address COL_ADD to the memory 150, the data of the cache 410 may be stored in the memory cells corresponding to the column address COL_ADD in the redundant row of the memory 150. This operation 515 may be performed multiple times while changing the column address COL_ADD so that all the data in the cache 410 may be written into the redundant row of the memory 150. After the write operation is completed, activation of the redundant row may be terminated. In other words, redundant rows may be precharged.

Through the above-described operation, defective memory cells detected in the memory 150 may be repaired with the redundant memory cells 250, and the data of the defective memory cells may be copied into the redundant memory cells 250. In other words, since the defect detected in the memory 150 is repaired in real-time (runtime), and the data are also copied into the repaired region, the memory system 100 may continue to perform normal operations.

Later, when the memory system 100 is rebooted, a defect address may be programmed into the non-volatile memory 210 for permanent repair. In this case, even though the power of the memory system 100 is turned off, the repair effect may last.

According to the embodiment of the present invention, a defect may be detected and repaired in real-time in a memory in the middle of the operation of a memory system.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory system, comprising:
a memory; and
a memory controller suitable for controlling the memory, wherein the memory comprises:
    a non-volatile memory suitable for storing a defect address;
    a register suitable for receiving and storing the defect address from the non-volatile memory during a boot-up operation, and receiving and storing an address that is input from the memory controller during a register access operation;
    a comparison circuit suitable for comparing the address stored in the register with an address that is input from the memory controller to produce a comparison result;
    redundant memory cells that are accessed according to the comparison result of the comparison circuit and a redundancy activation bit; and
    normal memory cells that are accessed according to the comparison result of the comparison circuit and the redundancy activation bit, and
wherein the memory controller is further suitable for:
    detecting a defect in the normal memory cells of the memory,
    storing an address corresponding to the defect in the register,
    reading data of defective memory cells among the normal memory cells by deactivating the redundancy activation bit and storing the read data in a cache, and
    writing the data of the cache into the redundant memory cells by activating the redundancy activation bit.

2. The memory system of claim 1, wherein the memory controller includes the cache.

3. The memory system of claim 1, wherein the redundant memory cells are accessed, when the comparison result of the comparison circuit shows that the address stored in the register and the address that is input from the memory controller are the same and when the redundancy activation bit is activated.

4. The memory system of claim 1,
wherein selected normal memory cells among the normal memory cells are accessed when the comparison result of the comparison circuit shows that the address stored in the register and the address that is input from the memory controller are different or when the redundancy activation bit is deactivated, and
wherein the selected normal memory cells are indicated by the address that is input from the memory controller.

5. A method for operating a memory system, comprising:
detecting, by a memory controller, defective memory cells of a memory;
replacing, by the memory controller, the defective memory cells with redundant memory cells of the memory by storing defect addresses corresponding to the defective memory cells in a register of the memory;
deactivating, by the memory controller, redundancy access of the memory;
reading, by the memory, data from the defective memory cells of the memory and transferring, by the memory, the read data to the memory controller;
storing, by the memory controller, the data in a cache of the memory controller;
activating, by the memory controller, redundancy access of the memory
transferring, by the memory controller, a write command, the defect address, and the data stored in the cache to the memory; and
writing, by the memory, the transferred data into the redundant memory cells.

6. The method of claim 5, further comprising correcting, by the memory controller, an error of the data read from the defective memory cells before the storing of the data in the cache of the memory controller.

7. The method of claim 5, further comprising programming, by the memory, the defect addresses into a non-volatile memory of the memory after the writing of the data stored in the cache into the redundant memory cells of the memory.

8. The method of claim 7, wherein the non-volatile memory includes a plurality of e-fuses.

9. A method for operating a memory system, comprising:
detecting, by a memory controller, defective memory cells of a memory;
replacing, by the memory controller, the defective memory cells with redundant memory cells of the memory by storing defect addresses corresponding to the defective memory cells in a register of the memory;

deactivating, by the memory controller, redundancy access of the memory;

reading, by the memory, data from the defective memory cells of the memory and storing, by the memory, the read data in a cache of the memory;

activating, by the memory controller, redundancy access of the memory; and writing, by the memory, the data stored in the cache into the redundant memory cells.

10. The method of claim 9, further comprising programming, by the memory, the defect addresses into a non-volatile memory of the memory, after the writing of the data stored in the cache into the redundant memory cells of the memory.

11. The method of claim 10, wherein the non-volatile memory includes a plurality of e-fuses.

* * * * *